United States Patent
Ahlstedt et al.

(10) Patent No.: US 9,343,596 B2
(45) Date of Patent: May 17, 2016

(54) METHOD FOR PRODUCING AT LEAST ONE RADIATION-EMITTING AND/OR -RECEIVING SEMICONDUCTOR COMPONENT, AND SEMICONDUCTOR COMPONENT

(71) Applicant: OSRAM Opto Semiconductors GmbH, Regensburg (DE)

(72) Inventors: Magnus Ahlstedt, Regensburg (DE); Johann Ramchen, Altdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 3 days.

(21) Appl. No.: 14/347,594

(22) PCT Filed: Sep. 21, 2012

(86) PCT No.: PCT/EP2012/068683
§ 371 (c)(1),
(2) Date: Mar. 26, 2014

(87) PCT Pub. No.: WO2013/045371
PCT Pub. Date: Apr. 4, 2013

(65) Prior Publication Data
US 2014/0231856 A1     Aug. 21, 2014

(30) Foreign Application Priority Data
Sep. 27, 2011  (DE) .......................... 10 2011 115 150

(51) Int. Cl.
*H01L 21/00*  (2006.01)
*H01L 31/0232*  (2014.01)
*H01L 33/54*  (2010.01)
(Continued)

(52) U.S. Cl.
CPC ............ *H01L 31/0232* (2013.01); *H01L 33/54* (2013.01); *H01L 33/58* (2013.01); *H01L 33/62* (2013.01); *H01L 2224/48091* (2013.01); *H01L 2224/48227* (2013.01); *H01L 2924/12044* (2013.01); *H01L 2933/005* (2013.01)

(58) Field of Classification Search
USPC ................................................... 257/E31.118
See application file for complete search history.

(56) References Cited

U.S. PATENT DOCUMENTS

2007/0029569 A1*  2/2007  Andrews .......................... 257/99
2007/0096129 A1    5/2007  Park
(Continued)

FOREIGN PATENT DOCUMENTS

CN         201766097 U       3/2011
DE       102009031008 A1    12/2010
(Continued)

*Primary Examiner* — Daniel Whalen
(74) *Attorney, Agent, or Firm* — Slater Matsil, LLP

(57) ABSTRACT

A method for producing a radiation-emitting or radiation-receiving semiconductor component is specified. In a method step, a carrier body having a mounting surface is provided. In a further method step, a barrier frame is formed on the mounting surface, in such a way that the barrier frame laterally encloses a mounting region of the mounting surface. In a further method step, a radiation-emitting or radiation-receiving semiconductor chip is mounted within the mounting region on the mounting surface. The semiconductor chip is potted with a liquid lens material, wherein the lens material is applied to the mounting surface within the mounting region. The lens material is cured. The mounting surface, the barrier frame and the lens material are adapted to one another.

8 Claims, 4 Drawing Sheets

(51) Int. Cl.
*H01L 33/58* (2010.01)
*H01L 33/62* (2010.01)

(56) References Cited

U.S. PATENT DOCUMENTS

| 2007/0131957 | A1 | 6/2007 | Brunner et al. |
| 2008/0007939 | A1 | 1/2008 | Lee et al. |
| 2008/0122123 | A1 | 5/2008 | Pang |
| 2009/0109688 | A1* | 4/2009 | Hsu et al. ............ 362/311.02 |
| 2011/0180830 | A1 | 7/2011 | Hwang et al. |
| 2012/0139003 | A1 | 6/2012 | Zitzlsperger et al. |

FOREIGN PATENT DOCUMENTS

| EP | 1659641 | A1 | 5/2006 |
| EP | 1901348 | A2 | 3/2008 |

* cited by examiner

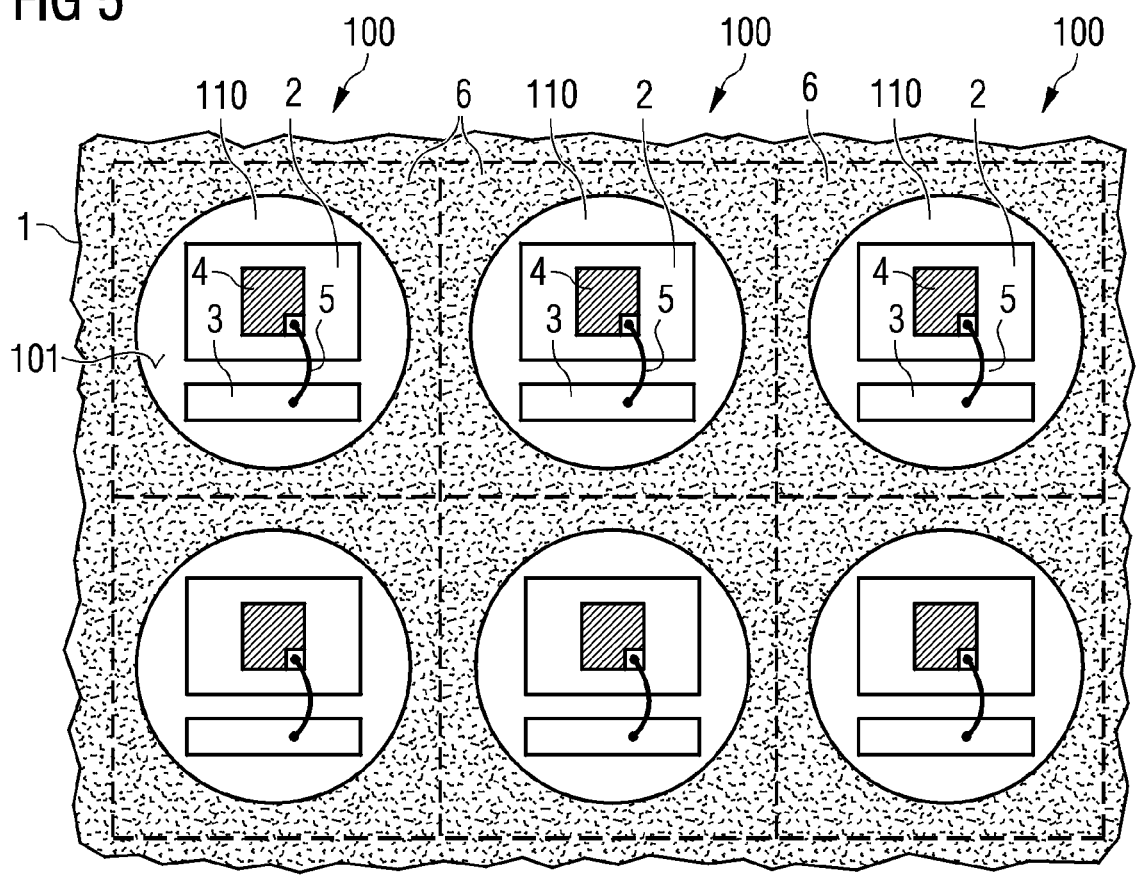

METHOD FOR PRODUCING AT LEAST ONE RADIATION-EMITTING AND/OR -RECEIVING SEMICONDUCTOR COMPONENT, AND SEMICONDUCTOR COMPONENT

This patent application is a national phase filing under section 371 of PCT/EP2012/068683, filed Sep. 21, 2012, which claims priority to German patent application 10 2011 115 150.1, filed Sep. 27, 2011, each of which is incorporated herein by reference in its entirety.

TECHNICAL FIELD

The present disclosure relates to a method for producing at least one radiation-emitting and/or radiation-receiving semiconductor component, and to a radiation-emitting and/or radiation-receiving semiconductor component.

BACKGROUND

By way of example, the U.S. Patent Application Publication No. 2007/0131957 A1 discloses a radiation-emitting semiconductor component comprising an injection-molded shaped plastic part on a carrier substrate, wherein a semiconductor chip is at least partly embedded.

SUMMARY OF THE INVENTION

Embodiments of the invention provide a particularly cost-effective method for producing a radiation-emitting and/or radiation-receiving semiconductor component, and a semiconductor component which can be produced particularly cost-effectively.

Embodiments of the invention provide a method for producing at least one radiation-emitting and/or radiation-receiving semiconductor component and by means of a radiation-emitting and/or radiation-receiving semiconductor component comprising the features of the independent patent claims.

A method for producing at least one radiation-emitting and/or radiation-receiving semiconductor component (hereinafter, "semiconductor component" for short) is specified. The method comprises the following steps:
providing a carrier body having a mounting surface;
forming a barrier frame on the mounting surface, in such a way that the barrier frame laterally encloses a mounting region of the mounting surface;
mounting a radiation-emitting and/or radiation-receiving semiconductor chip on the mounting region;
potting the semiconductor chip with a liquid lens material, wherein the lens material is applied to the mounting region of the mounting surface; and
curing the lens material.

In this case, the mounting surface, the barrier frame and the lens material are adapted to one another in particular in such a way that the mounting surface within the mounting region can be wetted by the lens material at least in places and the barrier frame cannot be wetted by the lens material, such that the lens material, when applied to the mounting surface, forms into a drop, which is delimited by the barrier frame at least in places—in particular laterally completely—and which has a convex outer surface, and leaves the barrier frame free.

The carrier body is a planar substrate, for example. The carrier body comprises at least at the mounting surface, for example, at least one metal, a ceramic material, a polymer material or a composite comprising at least two of said materials.

In one configuration, the carrier body is a printed circuit board. By way of example, it has conductor tracks on the mounting surface and/or on a surface situated opposite the mounting surface. In one configuration, the printed circuit board has plated-through holes (so-called "vias") which extend for the purpose of producing an electrically conductive connection from the mounting surface to an outer surface of the printed circuit board situated opposite the mounting surface.

The barrier frame is preferably embodied in such a way that it laterally delimits the mounting region. Preferably, it laterally completely encloses the mounting region. In other words, the mounting region is, in particular, that region of the mounting surface which is laterally enclosed by the barrier frame. To put it another way, an outer contour of the mounting region and an inner contour of the barrier frame coincide in a plan view of the mounting surface. The lens material, the barrier frame and the carrier body have, in particular, a common boundary line coinciding, for example, with the outer contour of the mounting region.

By way of example, a circular, oval, rectangular or square mounting region is formed by the barrier frame. The mounting region is expediently left free by the barrier frame in a plan view of the mounting surface of the carrier body.

The mounting of the semiconductor chip expediently comprises mechanically fixing the semiconductor chip on the mounting surface of the carrier body. In one configuration, an electrical contact between the semiconductor chip and the carrier body is produced simultaneously with the mechanical fixing. By way of example, the mounting region contains at least one first electrical connection area, the semiconductor chip is arranged in the mounting region in such a way that it overlaps the first electrical connection area at least in places and it is mechanically stably and electrically conductively connected to the first electrical connection area. During mounting in the mounting region, the semiconductor chip is preferably oriented in such a way that it is laterally spaced apart from the barrier frame.

In the present context, "lens material" denotes an encapsulation material which is at least partly transmissive—i.e., transparent or translucent—to the electromagnetic radiation emitted by the semiconductor chip and/or to the electromagnetic radiation to be received by the semiconductor chip. By way of example, the lens material is a transparent plastics material, in particular a silicone material.

Expediently, the lens material is curable. That is to say that it can be converted from the liquid state into a solid state, for example, by heating and/or by irradiation with light—in particular with ultraviolet light. By way of example, a reaction-curing silicone resin is used as lens material. Reaction-curing silicone resins are known in principle to a person skilled in the art and are therefore not explained in any greater detail at this juncture. The finished semiconductor component contains the lens material in the cured state.

The semiconductor chip can be, for example, a light-emitting diode chip or a laser diode chip which emits, in particular, infrared, visible and/or ultraviolet light. A photodiode or solar cell provided for receiving radiation can also be used as the semiconductor chip. In particular, the semiconductor chip is based on an inorganic semiconductor material. However, an organic light-emitting and/or organic light-receiving element such as an OLED ("organic light-emitting device", organic light-emitting diode) is also conceivable as the semiconductor chip.

The fact that the mounting surface can be wetted by the lens material is understood to mean in the present context, in particular, that the contact angle is less than 90°. The fact that the barrier frame cannot be wetted by the lens material is understood to mean in the present context, in particular, that the contact angle between the lens material and a surface of the barrier frame is greater than 90°.

In this case, the term contact angle denotes, in particular, the angle formed by a drop of the lens material on the mounting surface or on a surface of the barrier frame with respect to this surface. The contact angle is sometimes also designated as "edge angle" or "wetting angle".

Advantageously, the lens material can flow over the entire mounting region after being applied within the mounting region in the present method, such that the lens material covers the entire mounting region, in particular, in a plan view of the mounting surface. On account of the interfacial tensions involved, in particular, the barrier frame preferably holds the lens material back at the outer contour of the mounting region. At the same time—in particular likewise on account of the interfacial tensions involved—a drop having a convex outer surface forms, such that the lens material advantageously serves for the beam shaping of the light emitted and/or to be received by the semiconductor chip.

The method in accordance with the present disclosure can advantageously be carried out particularly rapidly and requires only comparatively inexpensive equipment, with the result that particularly cost-effective production of the components is obtained.

The barrier frame can advantageously be made very low in the method and respectively the component. In particular, the cavity formed by barrier frame and carrier body has such a small volume that, in the case of a material wettable by the lens material, said volume would be unsuitable for holding back the volume of the lens material applied within the mounting region.

The drop formed by the lens material is, for example, at least twice as high, preferably at least five times as high, and in particular at least 10 times as high, as the barrier frame. The height in this case is the dimension along the surface normal to the mounting surface. In one configuration, the thickness of the barrier frame is chosen in such a way that the semiconductor chip mounted on the mounting surface projects above the barrier frame, in particular in a direction away from the carrier body.

In accordance with at least one configuration, for the purpose of forming the barrier frame, a fluorocarbon polymer material is applied to the mounting surface of the carrier body. In one development, the fluorocarbon polymer material is dried after being applied.

A polymer material is understood to mean, in particular, a material which comprises or consists of polymers. A fluorocarbon polymer material contains, in particular, a perfluorinated hydrocarbon compound. To put it another way, a fluorocarbon polymer material is, in particular, a polymer material containing a perfluorinated hydrocarbon compound.

Preferably, the fluorocarbon polymer material is hydrophobic. The perfluorinated hydrocarbon compound preferably contains a compound, in particular a polymer, which contains the constituent

where n>3, wherein " . . . " stands for further constituents of the compound. The hydrophobic behavior can be obtained, for example, with such a constituent.

The fluorocarbon polymer material can be a thermoplastic or an elastomer. By way of example, the fluorocarbon polymer material is polytetrafluoroethylene (PTFE), polyvinylidene fluoride (PVDF)—in particular having the formula $(-CH_2-CF_2-)_n$ with a natural number n—, a perfluoroalkoxy polymer (PFA)—that is to say, in particular, a thermoplastic copolymer comprising tetrafluoroethylene with one or more perfluorinated vinyl ethers—, polychlorotrifluoroethylene (PCTFE)—in particular having the formula $(CF_2-CFCl-)_n$ with a natural number n—, a copolymer comprising one or more methacrylates and one or more perfluoroalkyl acrylates, a perfluorinated silicone, or a perfluoroethylene propylene copolymer (FEB).

The lens material can be applied by an inkjet printing method, for example. Alternatively, the lens material can be implemented by spraying or dropwise application.

The lens material is cured, for example, by heating in a furnace and/or by application of UV radiation, for example, a UV flash.

In accordance with at least one configuration, the mounting region has a first electrical connection area and a second electrical connection area. The second electrical connection area is electrically isolated from the first electrical connection area and arranged laterally alongside the first electrical connection area. Preferably, the first connection area and the second connection area are arranged completely within the barrier frame. In one development, a respective plated-through hole leads from the first connection area or the second connection area to the outer surface of the carrier body situated opposite the mounting surface. Alternatively or additionally, an electrical conductor track can be led away on the mounting surface from at least one of the electrical connection areas. In accordance with at least one development, the semiconductor chip is mounted at least on the first electrical connection area.

In accordance with at least one configuration, the semiconductor chip is mounted on the first electrical connection area in such a way that the second electrical connection area is arranged laterally with respect to the semiconductor body. By way of example, the semiconductor chip completely overlaps the first electrical connection area in a plan view of the mounting surface.

In this case, by way of example, a bonding wire is drawn from the semiconductor body to the second electrical connection area. In this way, by way of example, an electrically conductive connection is produced between a top side of the semiconductor chip, said top side facing away from the mounting surface, and the second electrical connection area.

In accordance with at least one configuration, the lens material is applied on the mounting region in such a way that it encloses the bonding wire at least in places and covers the two electrical connection areas. In particular, the bonding wire is embedded into the drop formed by the lens material.

In this way, in the completed component the bonding wire is protected against mechanical damage by the lens material. In the present method, a lens material of comparatively low viscosity can be used, as a result of which the risk of damage to the bonding wire during the process of applying the lens material is advantageously particularly low.

In accordance with at least one configuration of the method, a plurality of semiconductor components are produced. In this configuration, a carrier is provided, on which a plurality of barrier frames are formed. The carrier is provided for singulation into a plurality of carrier bodies. The barrier frames are formed, in particular, in such a way that each carrier body is provided with a barrier frame after singulation. In this case, the barrier frames are formed, in particular, in such a way that they are linked and form a grid. A respective mounting region is arranged in the grid cells of this grid, in which mounting region a respective radiation-emitting and/or radiation-receiving semiconductor chip is mounted and potted with the lens material. The grid is a rectangular grid, for example.

Expediently, in this configuration, the carrier and the grid formed by the barrier frames are severed along grid lines of the grid in order to singulate the semiconductor components in such a way that semiconductor components each comprising a carrier body and a barrier frame arise.

The severing is effected, for example, by sawing or laser separation. In this case, the sawing is effected, in particular, at imaginary boundary lines, or boundary lines marked on the carrier body, at which boundary lines, for example, the individual barrier frames of the semiconductor components merge into one another, and which boundary lines are designated as "grid lines" in the present case.

During singulation along the grid lines, the lens material advantageously need not be severed in the present method. In this way, the singulation can be effected particularly rapidly and is particularly cost-effective.

BRIEF DESCRIPTION OF THE DRAWINGS

Further advantages and advantageous configurations and developments of the method and of the component become apparent from the exemplary embodiments illustrated below in conjunction with the figures.

FIG. 5 shows a stage of a method for producing a plurality of radiation-emitting components in accordance with an embodiment in a stage corresponding to the embodiment of FIG. 2, in a schematic plan view.

Figure 1:
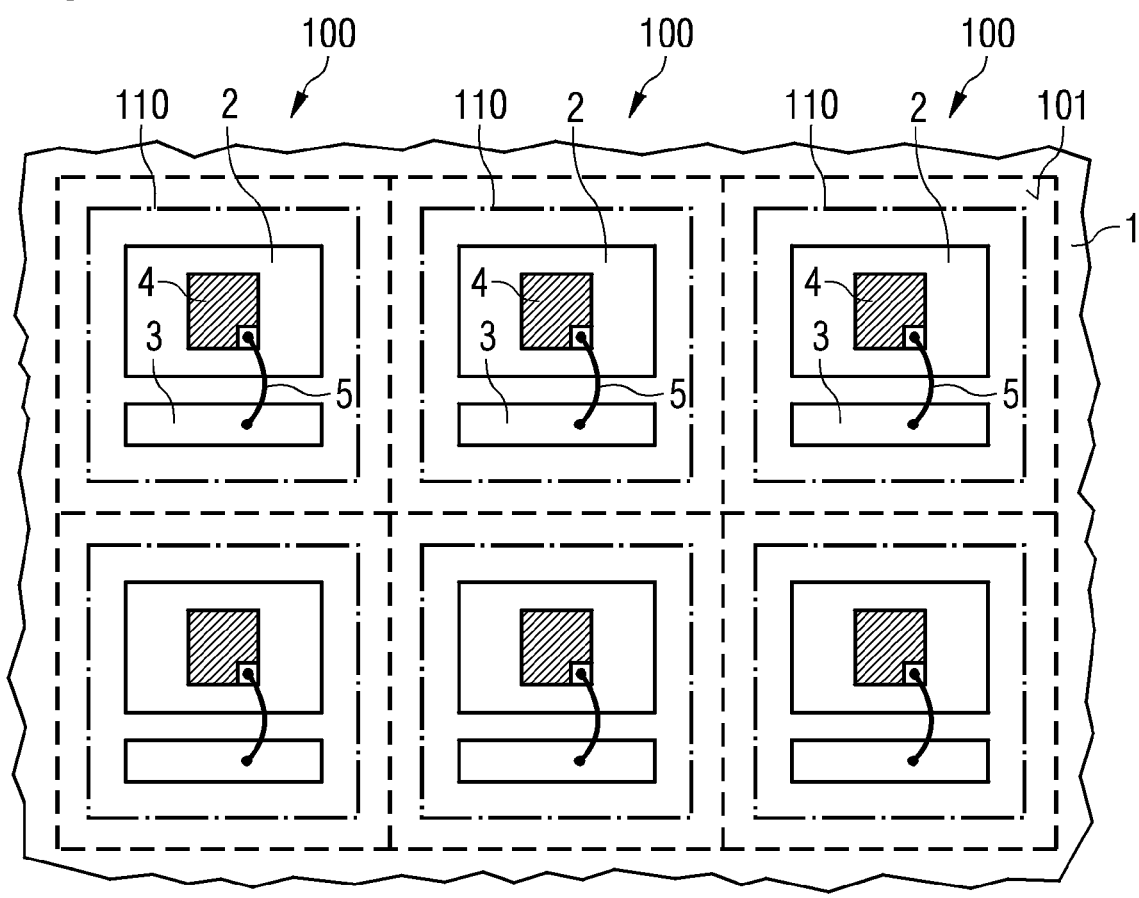
FIG. 1 shows a first stage of a method for producing a plurality of radiation-emitting semiconductor components in accordance with an embodiment in a schematic plan view.

In the figures and exemplary embodiments, identical or similar or identically acting elements are provided with the same reference signs. The figures and the size relationships of the elements illustrated in the figures should not be regarded as true to scale. Rather, individual elements may be illustrated with an exaggerated size in order to enable better illustration or in order to improve the ease of understanding.

DETAILED DESCRIPTION OF ILLUSTRATIVE EMBODIMENTS

FIGS. 1 to 4 show a method for producing a plurality of radiation-emitting semiconductor components in accordance with an embodiment.

In the method, a carrier 1 is provided, which is intended to be singulated to form a plurality of carrier bodies 10. In the present case, the carrier bodies 10 constitute printed circuit boards. Each of the carrier bodies 10 provided on the carrier 1 has a mounting region 110. Each of the mounting regions 110 contains a first electrical connection area 2 and a second electrical connection area 3.

FIG. 1 illustrates a schematic plan view of an excerpt from the carrier 1 which comprises six carrier bodies 10. In the present case, the carrier bodies 10 are arranged in rows and columns. In order to simplify the illustration, the reference signs are entered only in one of the two illustrated rows of carrier bodies 10.

In the first stage of the method as illustrated in FIG. 1, a radiation-emitting and/or radiation-receiving semiconductor chip 4, in particular a light-emitting diode chip or a laser diode chip, is mounted on each of the first electrical connection areas 2. For mounting purposes, a mechanically stable and in particular electrically conductive connection is produced between the semiconductor chip 4—in particular an underside of the semiconductor chip 4 facing the mounting surface 101—and the respective first electrical connection area 2.

A further electrically conductive connection is produced between the respective semiconductor chip 4—in particular the top side thereof facing away from the mounting surface 101—and the respective second electrical connection area 3, in the present case by a bonding wire 5. The first connection area 2 and the second connection area 3 are completely surrounded by the barrier frame. In other words, in a plan view of the carrier body 10 there is no overlap between the barrier frame 6 and the connection areas 2 and 3. Such an arrangement simplifies the singulation of the linked semiconductor components into individual semiconductor components 100 separated from one another.

In an alternative that is not illustrated in the figures, by way of example, a semiconductor chip 4 is used which has both electrical connections at its underside and is mounted on the first and second electrical connection areas 2, 3 such that one of the electrical connections overlaps the first electrical connection area 2 in a plan view of the mounting surface 101 and the second electrical connection overlaps the second electrical connection area 3.

Figure 2:
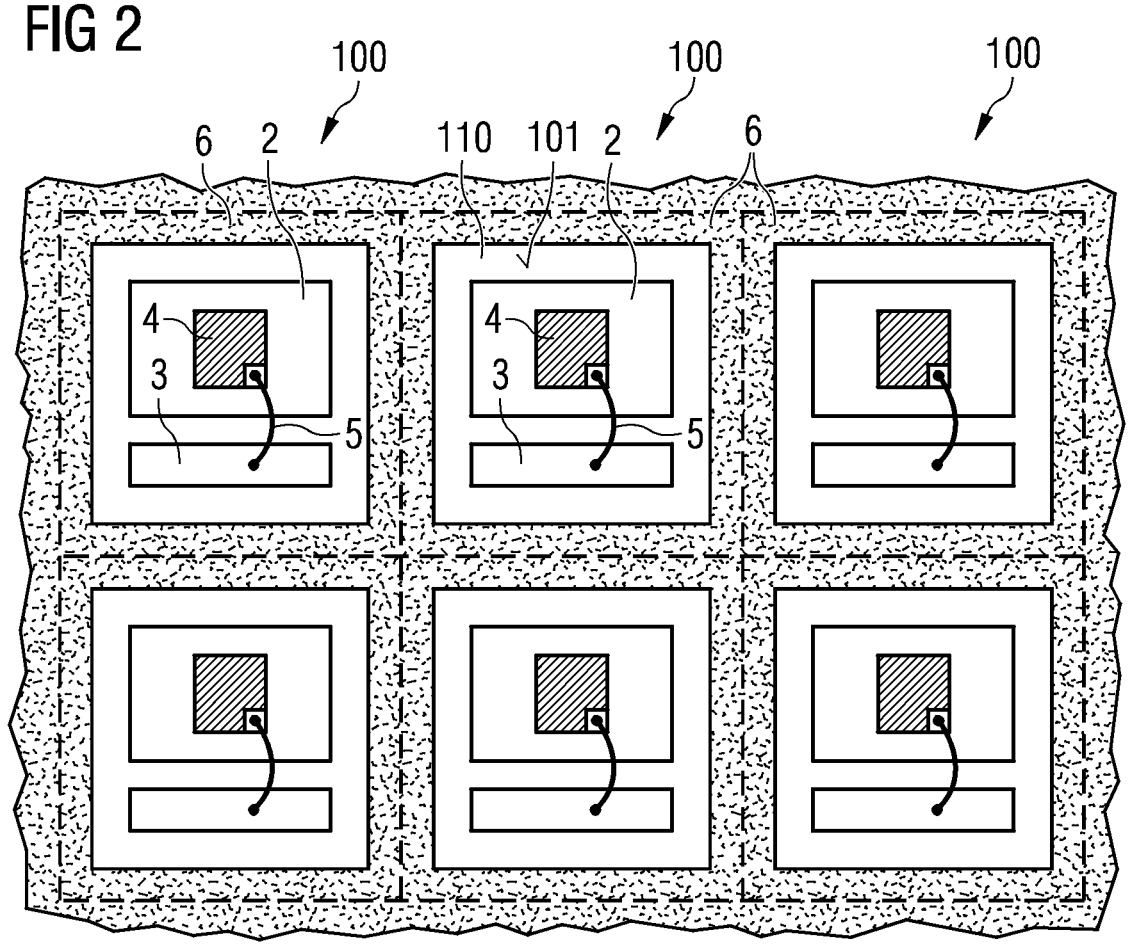
FIG. 2 shows a second stage of the method in accordance with an embodiment in a schematic plan view.

FIG. 2 shows a subsequent stage of the method in accordance with the first exemplary embodiment. In this stage of the method, barrier frames 6 are formed on the mounting surface 101. Each carrier body 10 contains a barrier frame 6 which laterally completely encloses the mounting region 110 and leaves it free in a plan view of the mounting surface 101.

The barrier frames 6 consist, for example, of one of the fluorocarbon polymer materials mentioned in the general part, for example, PTFE. They are applied to the carrier 1 by an inkjet printing method, in particular, and subsequently dried.

The barrier frames 6 assigned to the individual components 100 are embodied in a linked fashion on the carrier 1 and form a rectangular grid. Each cell of this grid constitutes a component 100 after completion and contains exactly one carrier body 10 having exactly one mounting region 110 and exactly one barrier frame 6.

The grid cells are indicated by dashed—imaginary—lines in FIGS. 1 to 4. However, the grid lines can also be identified with markings on the carrier 1, for example, in order to facilitate the singulation of the carrier 1 to form individual components 100.

Figure 3:
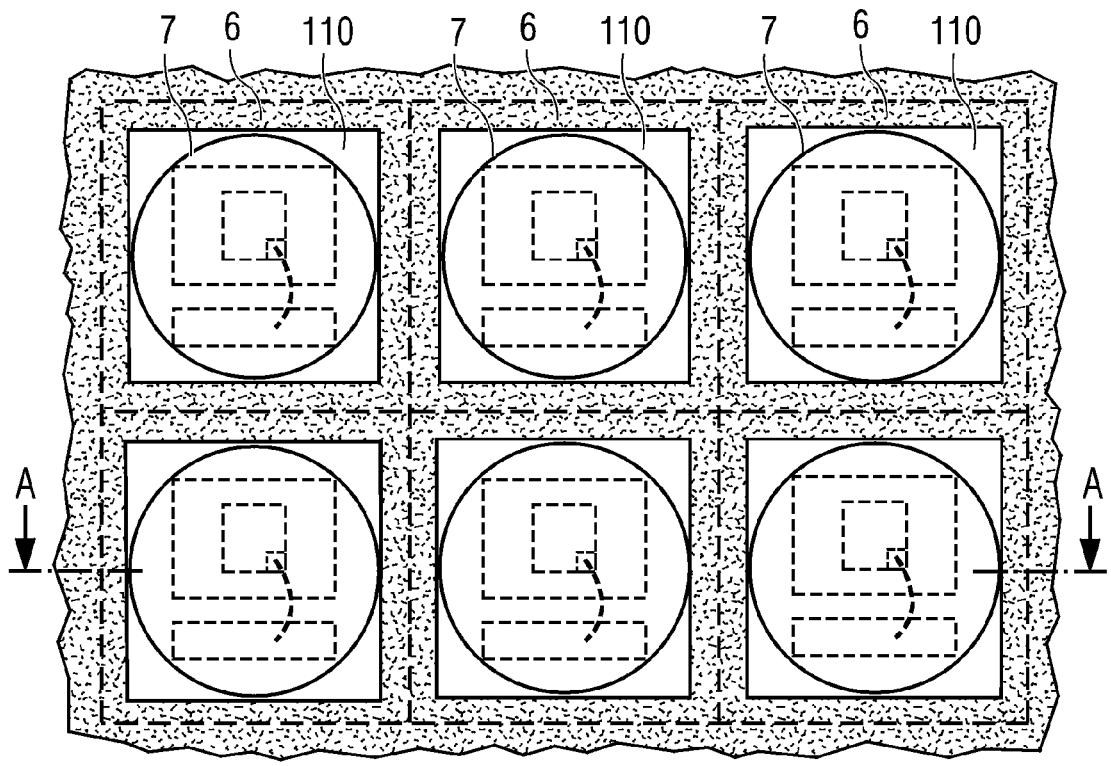
FIG. 3 shows a third stage of the method in accordance with an embodiment in a schematic plan view.

In the subsequent method stage, illustrated in FIG. 3, a transparent lens material 7, or lens material 7 provided with phosphor particles, is applied on the individual mounting regions 110. The liquid lens material is applied drop wise, for example, from a nozzle on the respective mounting region.

The material and the surface constitution of the mounting region 110—and in particular of the electrical connection areas 2, 3—and the lens material 7 are adapted to one another such that the mounting region 110—and in particular the electrical connection areas 2, 3—can be wetted by the lens material.

In this way, the lens material 7 is distributed over the entire mounting region 110 during application and/or after application.

In addition, the material of the barrier frames 6 and the lens material are adapted to one another in such a way that the barrier frames 6 is not wetted by the lens material 7. In this way, the lens material 7 does not run beyond the mounting region 110. The barrier frames 6 thus remain in a state not covered by the lens material 7 in a plan view of the mounting surface 101.

In the respective mounting region 110, on account of the interfacial tensions between mounting region 110, barrier frame 6 and lens material 10, the lens material forms into a drop having a convex outer surface. In this case, the base area of the drop is delimited by the inner contour of the barrier frame 6. The drop formed by the lens material 7 accordingly has the same base area as the mounting region 110.

In the method step illustrated in FIG. 3, the distribution of the lens material 7 over the entire mounting region 110 and the formation of the drop are not yet completely concluded.

Figure 4:
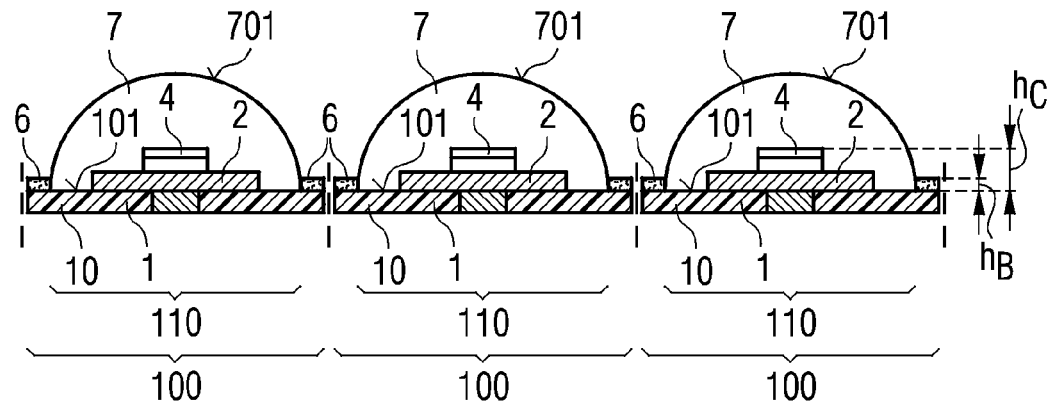
FIG. 4 shows a fourth stage of the method in accordance with an embodiment in a schematic sectional illustration.

FIG. 4 shows a schematic cross section along the plane A-A (see FIG. 3) in a subsequent stage of the method in accordance with an embodiment.

In the stage in accordance with FIG. 4, the lens material 7 has already flowed as far as the edges of the mounting regions 110, such that the lens material 7, the mounting surface 101 of the carrier body 10 and the barrier frame 6 have a common, closed boundary line. A drop having a convex outer surface 701 has formed in particular on account of the interfacial tensions.

The drop formed by the lens material 7—the lens of the component 100—projects beyond the barrier frame 6 in a direction away from the carrier body 10. The volume of the lens material 7 applied on a mounting region 110 is, for example, at least double the magnitude, in particular at least five times the magnitude, of the volume of the cavity formed by the barrier frame 6 together with the carrier body 10 of a component. In particular, the lens 7 in a direction away from the carrier body 10, in particular in the direction of a surface normal to the mounting surface 101, has an extent that is at least double the magnitude, preferably five times the magnitude, in particular ten times the magnitude, of the extent of the barrier frame 6 in this direction.

In this way, the lens material 7 covers the semiconductor chip 4, the first connection area 2, the second electrical connection area 3 and the bonding wire 5. In an embodiment at least one segment of the bonding wire 5 is enclosed.

In the method stage of FIG. 4, the individual components have already been singulated along the grid lines of the grid 8 by severing of the carrier body 10 and the linked barrier frames 6 to form individual components 100. Since the barrier frames 6 are not covered by the lens material 7, the latter advantageously needs not be severed during the singulation of the components 100. In this way, the singulation to form individual components can be effected particularly cost-effectively and rapidly.

The thickness $h_B$ of the barrier frame 6 is, in particular, also less than the height $h_C$ by which the semiconductor chip 4 projects beyond the mounting surface 101 of the carrier body 10.

FIG. 5 shows a schematic plan view of a method for producing a plurality of radiation-emitting and/or radiation-receiving semiconductor components 100 in accordance with a second exemplary embodiment. The method stage illustrated in FIG. 5 corresponds to the method stage in FIG. 2 of the method in accordance with an embodiment.

The embodiment of the method of FIG. 5 differs from the embodiment of the method of FIG. 2 in that the barrier frames 6 in each case enclose a circular mounting region 110—instead of a rectangular or square mounting region 110 as in the embodiment of FIG. 2. In this way, components 100 are obtained in which the lens material 7 forms into a drop having a round base area instead of a rectangular base area.

Advantageously, in the present method, the lens shape is adjustable in a simple manner by shaping of the barrier frame. The shape of the mounting regions 110 left free by the barrier frame 6 is adjustable in a simple manner, for example, by a photolithographic method step during the production of the barrier frames 6.

Embodiments of the invention are not restricted to the exemplary embodiments by the description on the basis of the exemplary embodiments, but rather encompasses any combination of elements and method steps of the various configurations and exemplary embodiments. Furthermore, embodiments of the invention encompass any combination of the patent claims and any combination of features disclosed in the patent claims.

The invention claimed is:

1. A method for producing radiation-emitting or radiation-receiving semiconductor components, the method comprising:
   providing a carrier comprising a plurality of carrier bodies, each carrier body having a mounting surface;
   forming a grid of linked barrier frames on the carrier, wherein each barrier frame laterally encloses a mounting region of the mounting surface, wherein each mounting region is arranged in a grid cell of the grid, and wherein forming the barrier frames comprises:
     applying a fluorocarbon polymer material on the carrier body; and
     subsequently drying the fluorocarbon polymer material;
   mounting, in each case, a radiation-emitting or radiation-receiving semiconductor chip within the mounting region on the mounting surface;
   applying, in each case, a liquid lens material to the mounting surface within the mounting region thereby potting the semiconductor chip;
   curing, in each case, the liquid lens material; and
   singulating the carrier along grid lines of the grid through the carrier and the barrier frames thereby forming the semiconductor components, each semiconductor component comprising a carrier body and a barrier frame,
   wherein, in each case, the mounting surface, the barrier frame and the lens material are adapted to one another, wherein the lens material forms a drop delimited by the barrier frame leaving the barrier frame free, and wherein the drop has a convex outer surface.

2. The method according to claim 1, wherein a height of the barrier frame is smaller than a height of the semiconductor chip.

3. The method according to claim 1, wherein the lens material comprises a silicone resin.

4. The method according to claim 1, wherein the carrier body at the mounting surface comprises a metal, a ceramic, a polymer material or a combination thereof.

5. The method according to claim 1, wherein the mounting region comprises a first electrical connection area and a second electrical connection area, wherein the second electrical connection area is electrically isolated from the first electrical connection area and arranged laterally alongside the first electrical connection area, and wherein the semiconductor chip is disposed on the first electrical connection area.

6. The method according to claim 5, wherein a plated-through hole is formed which leads from the first electrical connection area or from the second electrical connection area to an outer surface of the carrier body situated opposite the mounting surface.

7. The method according to claim 5, wherein the semiconductor chip is mounted on the first electrical connection area in such a way that the second electrical connection area is arranged laterally with respect to the semiconductor chip, wherein a bonding wire is drawn from the semiconductor chip to the second electrical connection area, and wherein the lens material is applied to the mounting region so that it covers the bonding wire and the first and second electrical connection areas.

8. A method for producing radiation-emitting or radiation-receiving semiconductor components, the method comprising:

provided a carrier comprising a plurality of carrier bodies, each carrier body having a mounting surface;

forming a grid of linked barrier frames on the carrier, each barrier frame laterally enclosing a mounting region of the mounting surface, wherein the mounting region comprising a first electrical connection area and a second electrical connection area, wherein the second electrical connection area is arranged laterally alongside the first electrical connection area, wherein the first electrical connection area and the second electrical connection area are arranged completely within the barrier frame, and wherein forming the barrier frames comprises:

applying a fluorocarbon polymer material on the carrier body; and subsequently drying the fluorocarbon polymer material;

mounting, in each case, a radiation-emitting or radiation-receiving semiconductor chip within the mounting region on the mounting surface, wherein the semiconductor chip is mounted on the first electrical connection area;

applying, in each case, a liquid lens material to the mounting surface within the mounting region thereby potting the semiconductor chip;

curing, in each case, the liquid lens material; and singulating the carrier along grid lines of the grid through the carrier and the barrier frames thereby forming the semiconductor components, each semiconductor component comprising a carrier body and a barrier frame, wherein, in each case, the mounting surface, the barrier frame and the lens material are adapted to one another, wherein the lens material forms a drop delimited by the barrier frame and leaving the barrier frame free, and wherein the drop has a convex outer surface.

* * * * *